(12) United States Patent
Kim et al.

(10) Patent No.: US 10,613,577 B2
(45) Date of Patent: Apr. 7, 2020

(54) SEMICONDUCTOR DEVICE

(71) Applicant: SK hynix Inc., Icheon (KR)

(72) Inventors: Hak Song Kim, Seoul (KR); Dong Kyun Kim, Cheongju (KR); Dong Uk Lee, Seoul (KR)

(73) Assignee: SK hynix Inc., Icheon (KR)

( * ) Notice: Subject to any disclaimer, the term of this patent is extended or adjusted under 35 U.S.C. 154(b) by 216 days.

(21) Appl. No.: 15/639,954

(22) Filed: Jun. 30, 2017

(65) Prior Publication Data

US 2018/0196464 A1 Jul. 12, 2018

(30) Foreign Application Priority Data

Jan. 11, 2017 (KR) .................. 10-2017-0004432

(51) Int. Cl.
| | | |
|---|---|---|
| G06F 1/12 | (2006.01) | |
| G06F 1/10 | (2006.01) | |
| G11C 7/10 | (2006.01) | |
| G11C 7/22 | (2006.01) | |
| G11C 11/4096 | (2006.01) | |
| G11C 11/4076 | (2006.01) | |

(52) U.S. Cl.
CPC ............. G06F 1/12 (2013.01); G06F 1/10 (2013.01); G11C 7/109 (2013.01); G11C 7/1066 (2013.01); G11C 7/1072 (2013.01); G11C 7/222 (2013.01); G11C 11/4076 (2013.01); G11C 11/4096 (2013.01)

(58) Field of Classification Search
CPC .................................... G06F 1/10; G06F 1/12
See application file for complete search history.

(56) References Cited

U.S. PATENT DOCUMENTS

| | | | | |
|---|---|---|---|---|
| 6,169,448 B1* | 1/2001 | Toshinori | ............ | H04L 27/2332 329/304 |
| 6,178,212 B1* | 1/2001 | Akashi | ............ | H04L 7/02 375/355 |
| 6,421,404 B1* | 7/2002 | Nakamura | ............ | H03L 7/0891 375/354 |
| 7,227,913 B1* | 6/2007 | Hein | ............ | H03L 7/081 375/327 |
| 9,673,963 B1* | 6/2017 | Ribo | ............ | H04L 7/033 |
| 10,063,365 B1* | 8/2018 | Ribo | ............ | H04L 7/005 |
| 2002/0090045 A1* | 7/2002 | Hendrickson | ............ | H03L 7/0814 375/376 |
| 2003/0227990 A1* | 12/2003 | Hsu | ............ | H03L 7/0891 375/376 |
| 2007/0081618 A1* | 4/2007 | Jeon | ............ | H03L 7/087 375/360 |

(Continued)

FOREIGN PATENT DOCUMENTS

KR    10-2016-0110604 A    9/2016

*Primary Examiner* — Phil K Nguyen

(57) ABSTRACT

A semiconductor device includes a detection signal generation circuit generating a detection signal by detecting a phase difference of an input signal and an internal clock, and generating delayed input signals by delaying the input signal. The semiconductor device further includes an output enable signal generation circuit outputting an output enable signal by selecting one of the delayed input signals in response to the detection signal and latching the selected one of the delayed input signals in synchronization with the internal clock. The output enable signal may initiate a data transfer operation.

18 Claims, 12 Drawing Sheets

(56) References Cited

U.S. PATENT DOCUMENTS

| | | | | |
|---|---|---|---|---|
| 2007/0252583 A1* | 11/2007 | Hokoiwa | ............ | G01R 31/3016 |
| | | | | 324/750.3 |
| 2008/0111596 A1* | 5/2008 | Lee | ................ | H03L 7/0814 |
| | | | | 327/153 |
| 2008/0252341 A1* | 10/2008 | Kim | ................ | G06F 1/04 |
| | | | | 327/157 |
| 2009/0040848 A1* | 2/2009 | Nitta | ................ | G11C 7/1078 |
| | | | | 365/194 |
| 2010/0123498 A1* | 5/2010 | Bae | ................ | H03L 7/07 |
| | | | | 327/158 |
| 2011/0085387 A1* | 4/2011 | Lee | ................ | G06Q 30/0251 |
| | | | | 365/189.02 |
| 2016/0118967 A1 | 4/2016 | Krishnamurthy et al. | | |

* cited by examiner

SEMICONDUCTOR DEVICE

CROSS-REFERENCE TO RELATED APPLICATION

The present application claims priority under 35 U.S.C. § 119(a) to Korean Patent Application No. 10-2017-0004432 filed on Jan. 11, 2017 in the Korean Intellectual Property Office, which is incorporated herein by reference in its entirety.

BACKGROUND

1. Technical Field

Embodiments of the present disclosure relate to a semiconductor device which performs a domain crossing operation between an external clock and an internal clock.

2. Related Art

In general, in the case of a semiconductor device including a double data rate synchronous dynamic random-access memory (DDR SDRAM), an internal clock is generated based on an external clock and is used as a reference clock for matching various operation timings in the semiconductor device. Thus, an internal clock generation circuit for generating the internal clock is disposed in the semiconductor device. Generally, because a skew occurs between the external clock and the internal clock due to an internal delay of the semiconductor device, a phase-locked loop (PLL) and a delay-locked loop (DLL) are used in the internal clock generation circuit.

Meanwhile, the semiconductor device receives a read command synchronized with the external clock, and outputs data stored therein, to an external source, in response to the internal clock. That is to say, the semiconductor device, when outputting data, uses not the external clock but the internal clock. Due to this fact, in a read operation, an operation of synchronizing the read command with the internal clock is performed. Such an operation of synchronizing a signal, which has been synchronized with a certain clock signal, with another clock signal is referred to as domain crossing.

SUMMARY

Various embodiments are directed to a semiconductor device which performs a domain crossing operation between an external clock and an internal clock having different phases, thereby stably performing data input/output operations.

In an embodiment, a semiconductor device may include a detection signal generation circuit suitable for generating a detection signal by detecting a phase difference of an input signal and an internal clock, and generating delayed input signals by delaying the input signal; and an output enable signal generation circuit suitable for outputting an output enable signal which enables a data output operation, by latching the delayed input signals in synchronization with the internal clock or in synchronization with an inverted signal of the internal clock in response to the detection signal.

In an embodiment, a semiconductor device may include: a detection signal generation circuit suitable for generating a detection signal by detecting a phase difference of an input signal and an internal clock, and generating delayed input signals by delaying the input signal; and an output enable signal generation circuit suitable for outputting an output enable signal which enables a data output operation, by latching the delayed input signals in synchronization with the internal clock or in synchronization with an inverted signal of the internal clock in response to the detection signal, and counting delay control signals for controlling an input time of the input signal, in response to the detection signal.

According to the embodiments, advantages may be provided in that, by performing a domain crossing operation between an external clock and an internal clock having different phases, it is possible to perform stably data input/output operations. Also, according to the embodiments, advantages may be provided in that, by comparing generation times of an input signal generated from an external clock and an internal clock and thereby controlling the input time of the input signal, it is possible to perform stably data input/output operations.

DETAILED DESCRIPTION

Hereinafter, a semiconductor device will be described below with reference to the accompanying drawings through various embodiments.

Figure 1:
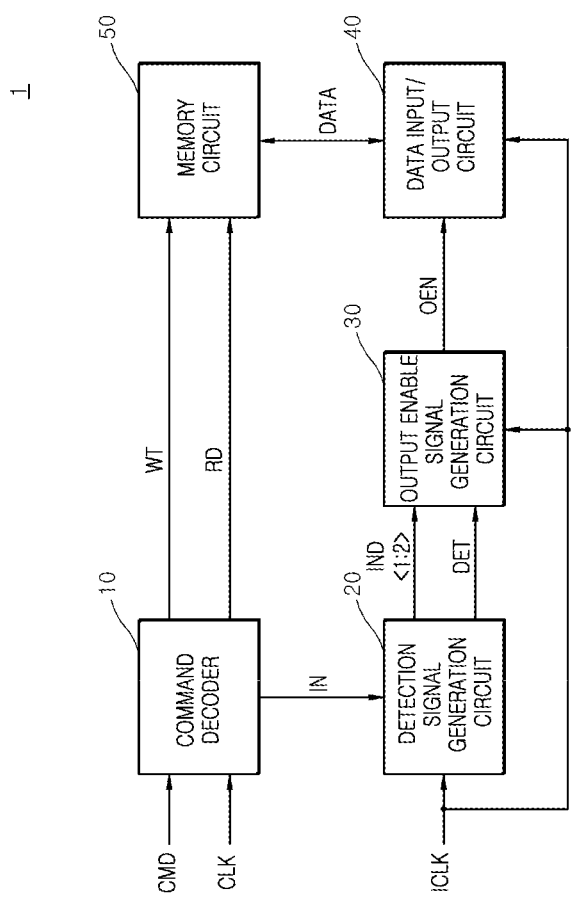
FIG. 1 is a block diagram illustrating a semiconductor device in accordance with an embodiment.

As shown in FIG. 1, a semiconductor device 1 in accordance with an embodiment may include a command decoder 10, a detection signal generation circuit 20, an output enable signal generation circuit 30, a data input/output circuit 40, and a memory circuit 50.

The command decoder 10 may decode an external command CMD in synchronization with an external clock CLK, and generate an input signal IN. The command decoder 10 may decode the external command CMD in synchronization with the external clock CLK, and generate a write signal WT and a read signal RD. The external command CMD may be a signal input from an external source to control the semiconductor device. The external clock CLK may be a signal input from the external source to synchronize an operation of the semiconductor device. The external command CMD and the external clock CLK may be transmitted through lines through which at least one of an address, a command, and data is transmitted. The external command CMD may be a signal including a plurality of bits, in an embodiment. The external clock CLK may be a signal which toggles. The input signal IN may be a signal which is generated from the external clock CLK and the external command CMD input from the external source.

The detection signal generation circuit 20 may generate a detection signal DET by detecting the phase difference of the input signal IN and an internal clock ICLK. The detection signal generation circuit 20 may generate first and second delayed input signals IND<1:2> by delaying the input signal IN. The detection signal DET may be a signal which has a logic high value when a time interval between a generation time of the internal clock ICLK (such as a time of a transition between first and second values of the internal clock ICLK) and an input time of the input signal IN (such as a time of a change in the a value of the input signal IN) is not equal to or greater than a preset period. For example, the detection signal DET has the logic high value when a time interval from a first time corresponding to a rising edge of the input signal IN to a second time corresponding to a rising edge of the internal clock ICLK is less than the preset period. The internal clock ICLK may be a signal which toggles. The internal clock ICLK may be generated using a phase-locked loop (PLL) or a delay-locked loop (DLL), which are disposed in the semiconductor device 1. The external clock CLK and the internal clock ICLK may be signals which have different phases.

The output enable signal generation circuit 30 may latch the first and second delayed input signals IND<1:2> in synchronization with the internal clock ICLK or an inverted version of the internal clock ICLK (or an inverted internal clock) in response to the detection signal DET, and output an output enable signal OEN which initiates a data transfer operation. The output enable signal generation circuit may latch the first delayed input signal IND<1> in synchronization with the internal clock ICLK and output the first delayed input signal IND<1> as the output enable signal OEN which initiates a data transfer operation, when the detection signal DET has a logic low value. The output enable signal generation circuit 30 may latch the second delayed input signal IND<2> in synchronization with the inverted signal of the internal clock ICLK and output the second delayed input signal IND<2> as the output enable signal OEN which initiates a data transfer operation, when the detection signal DET has a logic high value.

The data input/output circuit 40 may input or output data DATA in synchronization with the internal clock ICLK in response to the output enable signal OEN. The data input/output circuit 40 may input or output data DATA in synchronization with the internal clock ICLK for a period in which the output enable signal OEN has a logic high value. The data input/output circuit 40 may receive data DATA from external source and output the data DATA to the memory circuit 50, in synchronization with the internal clock ICLK for a period in which the output enable signal OEN has the logic high value, in a write operation. The data input/output circuit 40 may output data DATA received from the memory circuit 50, to the external source, in synchronization with the internal clock ICLK for a period in which the output enable signal OEN has the logic high value, in a read operation.

The memory circuit 50 may store the data DATA received from the data input/output circuit 40 in the write operation. The memory circuit 50 may store the data DATA received from the data input/output circuit 40, in response to the write signal WT. The memory circuit 50 may output the data DATA that has been stored in the write operation, to the data input/output circuit 40, in the read operation. The memory circuit 50 may output the data DATA that has been stored in the write operation, to the data input/output circuit 40, in response to the read signal RD.

Figure 2:
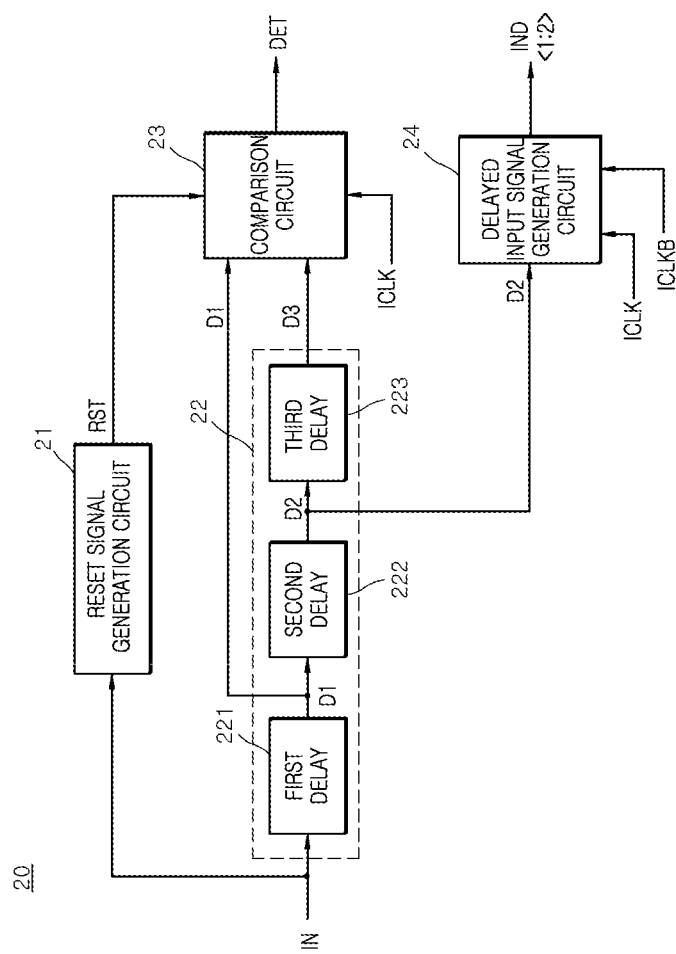
FIG. 2 is a block diagram illustrating a detection signal generation circuit included in the semiconductor device shown in FIG. 1, in accordance with an embodiment.

FIG. 2 is a block diagram illustrating a detection signal generation circuit suitable for use as the detection signal generation circuit 20 of FIG. 1, in accordance with an embodiment. Referring to FIG. 2, the detection signal generation circuit 20 may include a reset signal generation circuit 21, a delay signal generation circuit 22, a comparison circuit 23, and a delayed input signal generation circuit 24.

The reset signal generation circuit 21 may generate a reset signal RST which includes a pulse having a width corresponding to a predetermined period, in response to an input signal IN (e.g., the input signal IN of FIG. 1). The reset signal generation circuit 21 may generate the pulse in response to the input signal IN transitioning from a logic high level to a logic low level.

The delay signal generation circuit 22 may include a first delay circuit 221, a second delay circuit 222, and a third delay circuit 223. The first delay circuit 221 may generate a first delay signal D1 by delaying the input signal IN. The second delay circuit 222 may generate a second delay signal D2 by delaying the first delay signal D1. The third delay circuit 223 may generate a third delay signal D3 by delaying the second delay signal D2. Each of the first delay circuit 221, the second delay circuit 222 and the third delay 223 circuit may be a conventional delay circuit. Amounts of respective delays by the first delay circuit 221, the second delay circuit 222, and the third delay circuit 223 may be set to be substantially the same.

The delay signal generation circuit 22 may generate the first delay signal D1, the second delay signal D2, and the third delay signal D3 by sequentially delaying the input signal IN.

The comparison circuit 23 may generate a detection signal DET (e.g., the detection signal DET of FIG. 1) by comparing phases of the first delay signal D1 and the third delay signal D3 in synchronization with an internal clock ICLK (e.g., the internal clock ICLK of FIG. 1). The comparison circuit 23 may generate the detection signal DET by comparing the logic value of the first delay signal D1 and the logic value of the third delay signal D3 at a time corresponding to the rising edge of the internal clock ICLK. An operation of generating the detection signal DET will be described below in detail with reference to FIG. 4.

The delayed input signal generation circuit 24 may generate a first delayed input signal IND<1> by latching the second delay signal D2 in synchronization with the internal clock ICLK. The delayed input signal generation circuit 24 may generate a second delayed input signal IND<2> by delaying and then latching the second delay signal D2 in synchronization with an inverted internal clock ICLKB which corresponds to the inverted signal of the internal clock ICLK.

Figure 3:
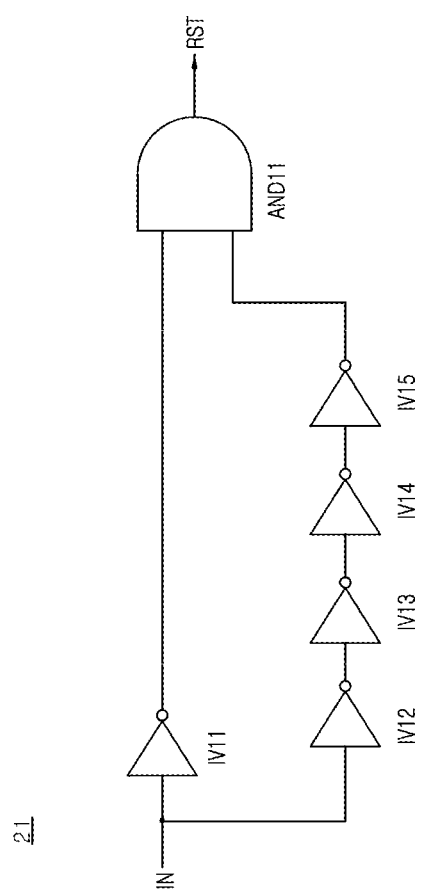
FIG. 3 is a circuit diagram illustrating a reset signal generation circuit included in the detection signal generation circuit shown in FIG. 2, in accordance with an embodiment.

FIG. 3 is a circuit diagram illustrating a reset signal generation circuit suitable for use as the reset signal generation circuit 21 of FIG. 2, in accordance with an embodiment. Referring to FIG. 3, the reset signal generation circuit 21 may include inverters IV11, IV12, IV13, IV14, and IV15 and an AND gate AND11.

The reset signal generation circuit 21 may generate a reset signal RST (e.g., the reset signal RST of FIG. 2) which includes a pulse having a width corresponding to a predetermined period, the predetermined period starting from a time at which an input signal IN transitions from a logic high value to a logic low value. The predetermined period may be determined according to the total amount of delays of the inverters IV12, IV13, IV14, and IV15.

Figure 4:
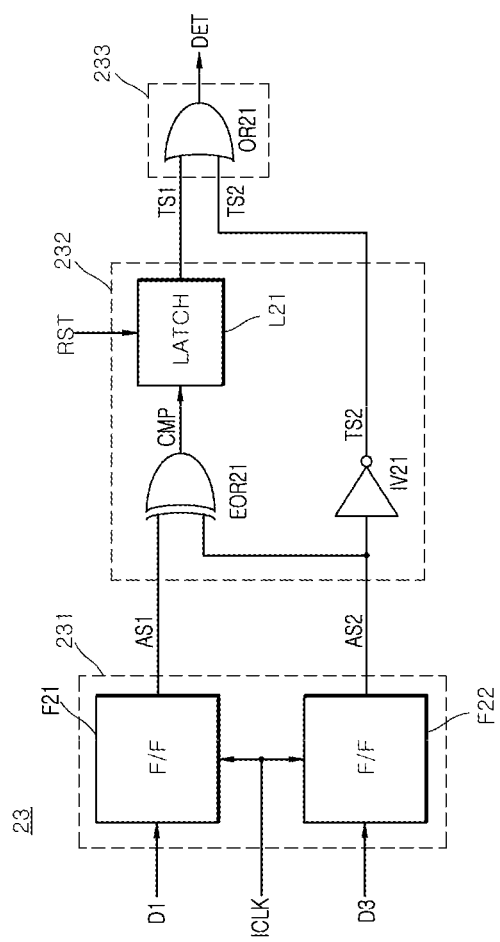
FIG. 4 is a diagram illustrating a comparison circuit included in the detection signal generation circuit shown in FIG. 2, in accordance with an embodiment.

FIG. 4 is a diagram illustrating a comparison circuit suitable for use as the comparison circuit 23 of FIG. 2, in accordance with an embodiment. Referring to FIG. 4, the comparison circuit 23 may include an alignment signal generation circuit 231, a transfer signal generation circuit 232, and a logic circuit 233.

The alignment signal generation circuit 231 may include a first alignment signal generation circuit F21 and a second alignment signal generation circuit F22.

The first alignment signal generation circuit F21 may latch the first delay signal D1 in synchronization with the internal clock ICLK, and output the latched first delay signal D1 as a first alignment signal AS1. The first alignment signal generation circuit F21 may latch the first delay signal D1 when an internal clock ICLK (e.g., the internal clock ICLK of FIG. 2) transitions from a logic low value to a logic high value. The first alignment signal generation circuit F21 may output the latched first delay signal D1 as the first alignment signal AS1. In an embodiment, the first alignment signal generation circuit F21 may be a flip-flop.

The second alignment signal generation circuit F22 may latch the third delay signal D3 in synchronization with the internal clock ICLK, and output the latched third delay signal D3 as a second alignment signal AS2. The second alignment signal generation circuit F22 may latch the third delay signal D3 when the internal clock ICLK transitions from the logic low value to the logic high value. The second alignment signal generation circuit F22 may output the latched third delay signal D3 as the second alignment signal AS2. In an embodiment, the second alignment signal generation circuit F22 may be a flip-flop.

The alignment signal generation circuit 231 may latch the first delay signal D1 in synchronization with the rising edge of the internal clock ICLK, and output the latched first delay signal D1 as the first alignment signal AS1. The alignment signal generation circuit 231 may latch the third delay signal D3 in synchronization with the rising edge of the internal clock ICLK, and output the latched third delay signal D3 as the second alignment signal AS2.

The transfer signal generation circuit 232 may include an equivalence gate EOR21, a latch L21, and an inverter IV21.

The equivalence gate EOR21 may generate a comparison signal CMP by comparing logic values of the first alignment signal AS1 and the second alignment signal AS2. The equivalence gate EOR21 may generate the comparison signal CMP having the logic high value, when the logic value of the first alignment signal AS1 and the logic value of the second alignment signal AS2 are different from each other. The equivalence gate EOR21 may generate the comparison signal CMP having the logic low value, when the logic value of the first alignment signal AS1 and the logic value of the second alignment signal AS2 are identical to each other. In an embodiment, the equivalence gate EOR 21 is an exclusive-or (XOR) gate.

The latch L21 may generate a first transfer signal TS1 having the logic high value, when the latch L21 receives the comparison signal CMP having the logic high value. The latch L21 may generate the first transfer signal TS1 which is initialized in response to a reset signal RST (e.g., the reset signal RST of FIG. 2). The latch L21 may generate the first transfer signal TS1 which is initialized, when the latch L21 receives the reset signal RST having a logic high value. The first transfer signal TS1 which is initialized may have the logic low value. In an embodiment, the latch L21 may be a flip-flop. For example, in an embodiment the latch L21 may be a set-reset flip-flop having a set input coupled to the comparison signal CMP and a reset input connected to the reset signal RST.

The inverter IV21 may generate a second transfer signal TS2 by inverting and buffering the second alignment signal AS2.

The transfer signal generation circuit 232 may generate the first transfer signal TS1 which is initialized in response to the reset signal RST. The transfer signal generation circuit 232 may generate the first transfer signal TS1 by comparing the logic values of the first alignment signal AS1 and the second alignment signal AS2. The transfer signal generation circuit 232 may generate the second transfer signal TS2 by inverting and buffering the second alignment signal AS2.

The logic circuit 233 may include an OR gate OR21, and generate a detection signal DET (e.g., the detection signal DET of FIG. 2) having the logic high value, when one or both of the first transfer signal TS1 and the second transfer signal TS2 has the logic high value. The logic circuit 233 may generate the detection signal DET by performing an OR logic operation on the first transfer signal TS1 and the second transfer signal TS2.

Figure 5:
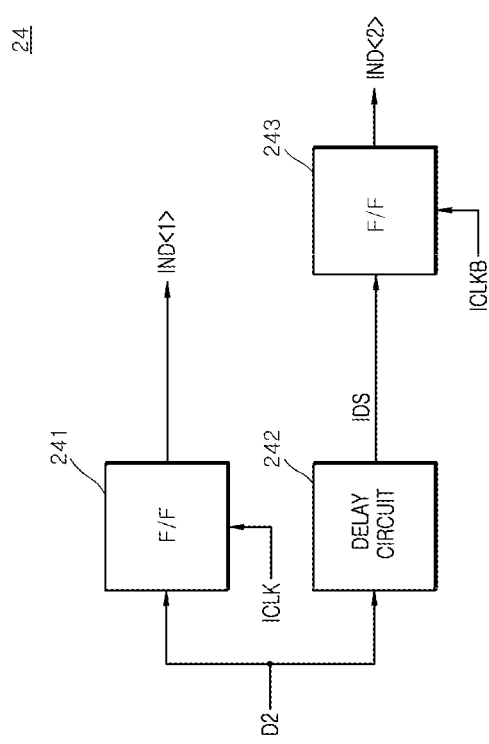
FIG. 5 is a diagram illustrating a delayed input signal generation circuit included in the detection signal generation circuit shown in FIG. 2, in accordance with an embodiment.

FIG. 5 is a diagram a delayed input signal generation circuit suitable for use as the delayed input signal generation circuit 24 of FIG. 2, in accordance with an embodiment. Referring to FIG. 5, the delayed input signal generation circuit 24 may include a first delayed input signal generation circuit 241, a delay circuit 242, and a second delayed input signal generation circuit 243.

The first delayed input signal generation circuit 241 may latch a second delay signal D2 (e.g., the second delay signal D2 of FIG. 2) in synchronization with an internal clock ICLK (e.g., the internal clock ICLK of FIG. 2), and output the latched second delay signal D2 as a first delayed input signal IND<1>. The first delayed input signal generation circuit 241 may latch the second delay signal D2 in response to the internal clock ICLK transitioning from a logic low value to a logic high value. The first delayed input signal generation circuit 241 may output the latched second delay signal D2 as the first delayed input signal IND<1>. In an embodiment, the first delayed input signal generation circuit 241 may be a flip-flop.

Figure 7:
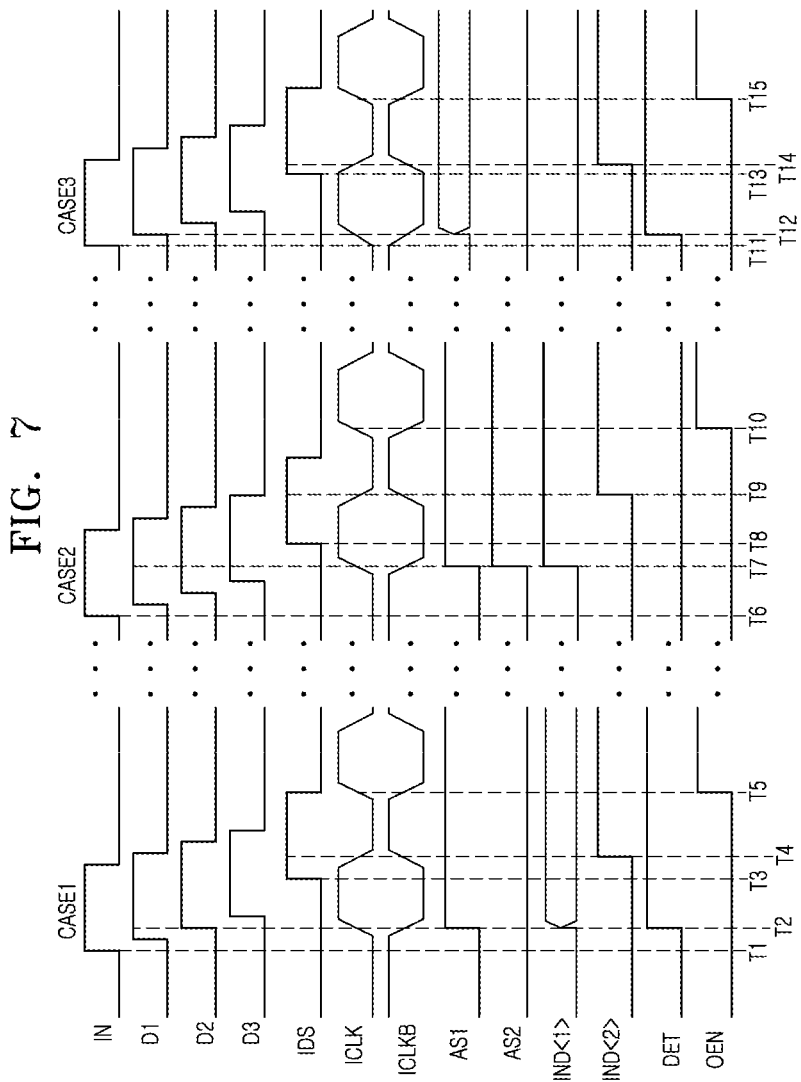
FIG. 7 is a timing diagram illustrating waveforms related to an operation of the semiconductor device shown in FIG. 1, in accordance with the embodiment.

The delay circuit 242 may generate an internal delay signal IDS by delaying the second delay signal D2. In an embodiment, the delay circuit 242 may generate the internal delay signal IDS by delaying the second delay signal D2 by a time interval corresponding to a half cycle of the internal clock ICLK. However, embodiments of the present disclosure are not limited thereto, and the delay amount of the delay circuit 242 may vary according to embodiments. For example, FIG. 7 illustrates an embodiment wherein the delay circuit 242 generates the internal delay signal IDS by delaying the second delay signal D2 by a time interval substantially less than a half cycle of the internal clock ICLK. In an embodiment, a total delay of the internal delay signal IDS relative to the input signal IN (that is, a total delay of the delay circuit 242 of FIG. 5 and the first and second delay circuits 221 and 222 of FIG. 2) is substantially equal to the duration of the half cycle of the internal clock ICLK, as shown in FIG. 7.

The second delayed input signal generation circuit 243 may latch the internal delay signal IDS in synchronization with an inverted internal clock ICLKB corresponding to an inverted version of the internal clock ICLK, and output the latched internal delay signal IDS as a second delayed input signal IND<2>. The second delayed input signal generation circuit 243 may latch the internal delay signal IDS in response to the inverted internal clock ICLKB transitioning from the logic low value to the logic high value. The second delayed input signal generation circuit 243 may output the latched internal delay signal IDS as the second delayed input signal IND<2>. In an embodiment, second delayed input signal generation circuit 243 may be a flip-flop.

Figure 6:
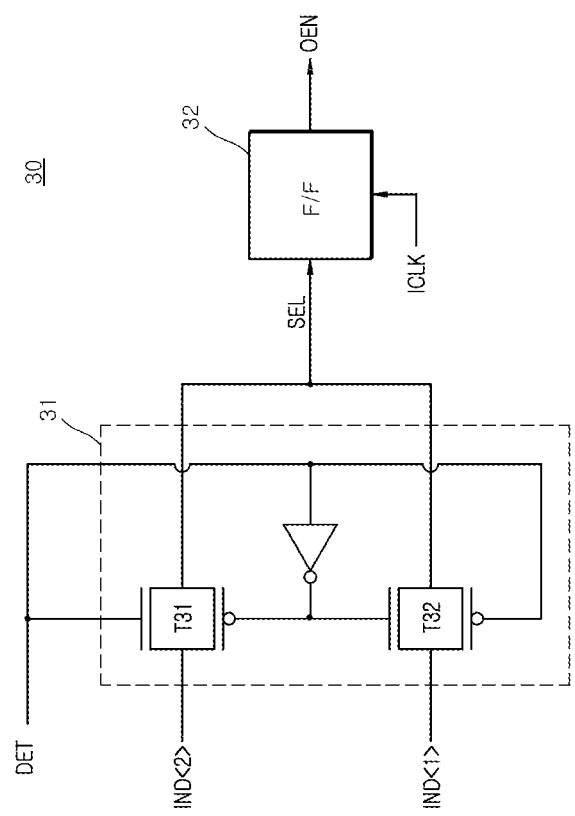
FIG. 6 is a block diagram illustrating an output enable signal generation circuit included in the semiconductor device shown in FIG. 1, in accordance with an embodiment.

FIG. 6 is a block diagram illustrating an output enable signal generation circuit suitable for use as the output enable signal generation circuit 30 of FIG. 1, in accordance with an embodiment. Referring to FIG. 6, the output enable signal generation circuit 30 may include a selective transfer circuit 31 and an output enable signal output circuit 32.

The selective transfer circuit 31 may include first and second transfer gates T31 and T32. The first transfer gate T31 may be turned on when the detection signal DET has the logic high value, and output the second delayed input signal IND<2> as a select signal SEL. The second transfer gate T32 may be turned on when the detection signal DET is the logic low value, and output the first delayed input signal IND<1> as the select signal SEL. That is, the selective transfer circuit 31 may output the second delayed input signal IND<2> as the select signal SEL when the detection signal DET has the logic high value, and output the first delayed input signal IND<1> as the select signal SEL when the detection signal DET has the logic low value.

The output enable signal output circuit 32 may latch the select signal SEL in synchronization with the internal clock ICLK, and output the latched select signal SEL as an output enable signal OEN (e.g., the output enable signal OEN of FIG. 1). The output enable signal output circuit 32 may latch the select signal SEL in response to the internal clock ICLK transitioning from the logic low value to the logic high value. The output enable signal output circuit 32 may output the latched select signal SEL as the output enable signal OEN. In an embodiment, the output enable signal output circuit 32 may be a flip-flop.

The output enable signal generation circuit 30 may output the first delayed input signal IND<1> as the output enable signal OEN when the detection signal DET has the logic low value, in synchronization with the internal clock ICLK. The output enable signal generation circuit 30 may output the second delayed input signal IND<2> as the output enable signal OEN when the detection signal DET has the logic high value, in synchronization with the internal clock ICLK.

An operation of generating the output enable signal OEN to perform a domain crossing operation between an input signal IN (e.g., the input signal IN of FIG. 1) generated from an external signal CLK (e.g., the external clock CLK of FIG. 1) and an internal clock ICLK (e.g., the internal clock ICLK of FIG. 1) in a semiconductor device (e.g., the semiconductor device 1 of FIG. 1), in accordance with an embodiment will be described below with reference to FIGS. 1 to 7. FIG. 7 illustrates waveforms related to a first case CASE1 where an input time of the input signal IN is late, a second case CASE2 where an input time of the input signal IN is normal, and a third case CASE3 where an input time of the input signal IN is very late, wherein lateness is relative to a rising edge of the internal clock ICLK.

First, an operation of the semiconductor device will be described below for the first case CASE1.

At a first time T1, the command decoder 10 of FIG. 1 decodes the external command CMD in synchronization with the external clock CLK, and generates the input signal IN having a logic high value.

The delay signal generation circuit 22 of FIG. 2 delays the input signal IN, and generates the first delay signal D1, the second delay signal D2, and the third delay signal D3. The delay signal generation circuit 22 sequentially generates the first delay signal D1, the second delay signal D2, and the third delay signal D3 to each have the logic high value, after the first time T1 in accordance with the respective delay times of the first to third delay signals D1 to D3.

At a second time T2, the alignment signal generation circuit 231 of the comparison circuit 23 of FIG. 4 latches the first delay signal D1 having the logic high value in synchronization with the rising edge of the internal clock ICLK, and outputs the latched first delay signal D1 as the first alignment signal AS1. The alignment signal generation circuit 231 latches the third delay signal D3 having the logic low value in synchronization with the rising edge of the internal clock ICLK, and outputs the latched third delay signal D3 as the second alignment signal AS2.

The transfer signal generation circuit 232 of FIG. 4 generates the first transfer signal TS1 having the logic high value by comparing the logic values of the first alignment signal AS1 and the second alignment signal AS2. The transfer signal generation circuit 232 generates the second transfer signal TS2 having the logic high value by inverting and buffering the second alignment signal AS2 having the logic low value.

The logic circuit 233 of FIG. 4 generates the detection signal DET having the logic high value, by performing an OR logic operation on the first transfer signal TS1 having the logic high value and the second transfer signal TS2 having the logic high value. The detection signal DET having the logic high value indicates that a time interval between a generation time of the internal clock ICLK and an input time of the input signal IN is not equal to or greater than the preset period. For example, the input time of the input signal IN corresponds to a rising edge of the input signal IN, and the generation time of the internal clock ICLK corresponds to a rising edge of the internal clock ICLK. The preset period is determined as a time period sufficiently long to make the first delay signal D1, the second delay signal D2, and the third delay signal D3 have the logic high value at the generation time of the internal clock ICLK. For example, the preset period is greater than the total amount of delays in the first delay circuit 221, the second delay circuit 222, and the third delay circuit 223 of FIG. 2.

The first delayed input signal generation circuit 241 of FIG. 5 latches the second delay signal D2 in synchronization with the rising edge of the internal clock ICLK, and outputs the latched second delay signal D2 as the first delayed input signal IND<1>. At the second time T2 when the internal clock ICLK is transitioning from the logic low value to the logic high value, the second delay signal D2 is transitioning from the logic low value to the logic high value, and as a result the first delayed input signal IND<1> may be indeterminate, that is, it may have the logic high value or the logic low value. In other words, the first delayed input signal IND<1> is in an abnormal state.

At a third time T3, the delay circuit 242 of FIG. 5 generates the internal delay signal IDS having the logic high value by delaying the second delay signal D2.

At a fourth time T4, the second delayed input signal generation circuit 243 of FIG. 5 latches the internal delay signal IDS having the logic high level in synchronization with the rising edge of the inverted internal clock ICLKB, and outputs the latched internal delay signal as the second delayed input signal IND<2>.

The selective transfer circuit 31 of FIG. 6 outputs the second delayed input signal IND<2> as the select signal SEL in response to the detection signal DET having the logic high level.

At a fifth time T5, the output enable signal output circuit 32 of FIG. 6 outputs the select signal SEL having the logic high value as the output enable signal OEN in synchronization with the rising edge of the internal clock ICLK.

The data input/output circuit 40 of FIG. 1 outputs data DATA to the memory circuit 50 of FIG. 1 in synchronization with the internal clock ICLK in a write operation, and outputs data DATA received from the memory circuit 50 to the external source in a read operation, in response to the output enable signal OEN having the logic high value.

The memory circuit 50 may store the data DATA received from the data input/output circuit 40 in the write operation, and output the stored data DATA to the data input/output circuit 40 in the read operation.

Next, an operation of the semiconductor device 1 of FIG. 1 will be described below for the second case CASE2 where an input time of the input signal IN is normal. For example, a time interval between a generation time of the internal clock ICLK and the input time of the input signal IN is equal to or greater than the preset period.

At a sixth time T6, the command decoder 10 of FIG. 1 decodes the external command CMD in synchronization with the external clock CLK, and generates the input signal IN having the logic high value.

The delay signal generation circuit 22 of FIG. 2 delays the input signal IN, and generates the first delay signal D1, the second delay signal D2, and the third delay signal D3. The delay signal generation circuit 22 sequentially generates the first delay signal D1, the second delay signal D2, and the third delay signal D3 to each have the logic high value, after the sixth time T6 in accordance with the respective delay times of the first to third delay signals D1 to D3.

At a seventh time T7, the alignment signal generation circuit 231 of the comparison circuit 23 shown in FIG. 4 latches the first delay signal D1 having the logic high value in synchronization with the rising edge of the internal clock ICLK, and outputs the latched first delay signal as the first alignment signal AS1. The alignment signal generation circuit 231 latches the third delay signal D3 having the logic high value in synchronization with the rising edge of the internal clock ICLK, and outputs the latched third delay signal as the second alignment signal AS2.

The transfer signal generation circuit 232 of FIG. 4 generates the first transfer signal TS1 having the logic low value by comparing the logic values of the first alignment signal AS1 and the second alignment signal AS2. The transfer signal generation circuit 232 generates the second transfer signal TS2 having a logic low value by inverting and buffering the second alignment signal AS2 having a logic high value.

The logic circuit 233 generates the detection signal DET having the logic low value, by performing an OR logic operation on the first transfer signal TS1 having the logic low value and the second transfer signal TS2 having the logic low value. The detection signal DET having the logic low value indicates that a time interval between a generation time of the internal clock ICLK and an input time of the input signal IN is equal to or greater than the preset period.

The first delayed input signal generation circuit 241 of FIG. 5 latches the second delay signal D2 of the logic high value in synchronization with the rising edge of the internal clock ICLK, and outputs the latched second delay signal as the first delayed input signal IND<1>.

At an eighth time T8, the delay circuit 242 of the delayed input signal generation circuit 24 generates the internal delay signal IDS having the logic high value by delaying the second delay signal D2.

At a ninth time T9, the second delayed input signal generation circuit 243 of the delayed input signal generation circuit 24 latches the internal delay signal IDS having the logic high value in synchronization with the rising edge of the inverted internal clock ICLKB, and outputs the latched internal delay signal as the second delayed input signal IND<2>.

The selective transfer circuit 31 of FIG. 6 outputs the first delayed input signal IND<1> as the select signal SEL in response to the detection signal DET having the logic low value.

At a tenth time T10, the output enable signal output circuit 32 of FIG. 6 outputs the select signal SEL having the logic high value as the output enable signal OEN in synchronization with the rising edge of the internal clock ICLK.

The data input/output circuit 40 of FIG. 1 outputs data DATA to the memory circuit 50 of FIG. 1 in synchronization with the internal clock ICLK in a write operation, and outputs data DATA received from the memory circuit 50 to the external source in a read operation, in response to the output enable signal OEN having a logic high value.

The memory circuit 50 may store the data DATA received from the data input/output circuit 40 in the write operation, and output the stored data DATA to the data input/output circuit 40 in the read operation.

Subsequently, an operation of the semiconductor device 1 of FIG. 1 will be described below for the third case CASE3 where an input time of the input signal IN is later than the CASE1.

At an eleventh time T11, the command decoder 10 of FIG. 1 decodes the external command CMD in synchronization with the external clock CLK, and generates the input signal IN having the logic high value.

The delay signal generation circuit 22 of FIG. 2 delays the input signal IN, and generates the first delay signal D1, the second delay signal D2, and the third delay signal D3. The delay signal generation circuit 22 sequentially generates the first delay signal D1, the second delay signal D2, and the third delay signal D3 to each have the logic high value, after the eleventh time T11 in accordance with the respective delay times of the first to third delay signals D1 to D3.

At a twelfth time T12, the alignment signal generation circuit 231 of FIG. 4 latches the first delay signal D1 having the logic high value in synchronization with the rising edge of the internal clock ICLK, and outputs the latched first delay signal as the first alignment signal AS1. The alignment signal generation circuit 231 latches the third delay signal D3 having the logic low value in synchronization with the rising edge of the internal clock ICLK, and outputs the latched third delay signal as the second alignment signal AS2. At the twelfth time T12, because the first delay signal D1 transitions from the logic low value to the logic high value when the internal clock ICLK is also transitioning from the logic low value to the logic high value, the first alignment signal AS1 may be indeterminate, that is, may have the logic high value or the logic low value. In other words, the first alignment signal AS1 is in an abnormal state.

The transfer signal generation circuit 232 of FIG. 4 generates the first transfer signal TS1 having the logic high value or the logic low value by comparing the logic values of the first alignment signal AS1 and the second alignment signal AS2. The transfer signal generation circuit 232 generates the second transfer signal TS2 having the logic high value by inverting and buffering the second alignment signal AS2 having the logic low value.

The logic circuit 233 of FIG. 4 generates the detection signal DET having the logic high value, in response to the second transfer signal TS2 having the logic high value. The detection signal DET having the logic high value indicates that a time interval between a generation time of the internal clock ICLK and an input time of the input signal IN is not equal to or greater than the preset period.

The first delayed input signal generation circuit 241 of FIG. 5 latches the second delay signal D2 having the logic low value in synchronization with the rising edge of the internal clock ICLK, and outputs the latched second delay signal as the first delayed input signal IND<1>.

At a thirteenth time T13, the delay circuit 242 of FIG. 5 generates the internal delay signal IDS having the logic high value by delaying the second delay signal D2.

At a fourteenth time T14, the second delayed input signal generation circuit 243 of FIG. 5 latches the internal delay signal IDS having the logic high value in synchronization with the rising edge of the inverted internal clock ICLKB, and outputs the latched internal delay signal as the second delayed input signal IND<2>.

The selective transfer circuit 31 of FIG. 6 outputs the second delayed input signal IND<2> as the select signal SEL in response to the detection signal DET having the logic high value.

At a time T15, the output enable signal output circuit 32 of the output enable signal generation circuit 30 outputs the select signal SEL of the logic high value as the output enable signal OEN in synchronization with the rising edge of the internal clock ICLK.

The data input/output circuit 40 outputs data DATA to the memory circuit 50 in synchronization with the internal clock ICLK in a write operation and outputs data DATA outputted from the memory circuit 50, to the external source in a read operation, in response to the output enable signal OEN of the logic high value.

The memory circuit 50 may store the data DATA outputted from the data input/output circuit 40 in the write operation, and output the data DATA stored therein, to the data input/output circuit 40, in the read operation.

As described above, the semiconductor device 1 of FIG. 1 in accordance with the embodiment performs a domain crossing operation between the input signal IN and the internal clock ICLK, regardless of an input time of the input signal IN generated from the external clock CLK, resulting in a stable data input/output operation.

Figure 8:
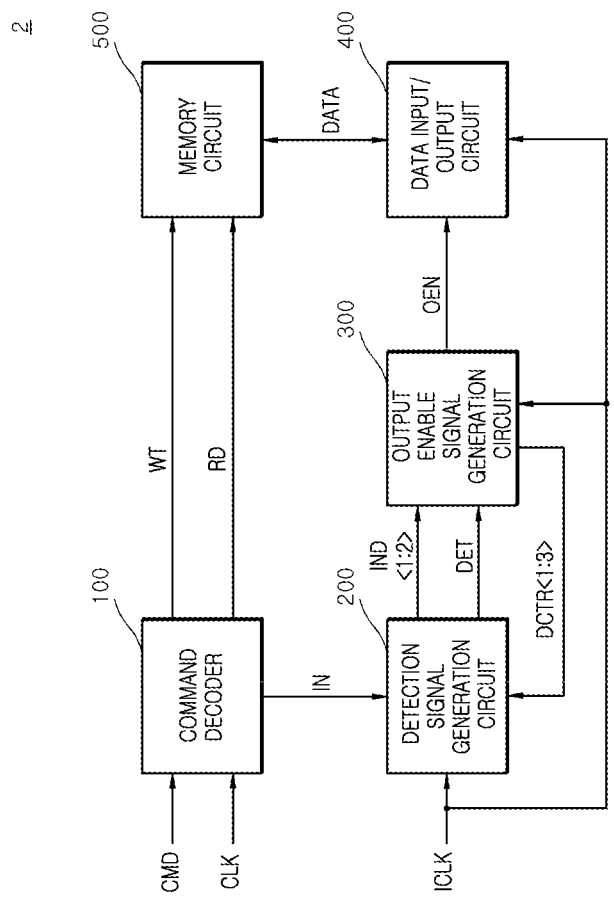
FIG. 8 is a block diagram illustrating a semiconductor device in accordance with another embodiment.

Referring to FIG. 8, a semiconductor device 2 in accordance with another embodiment may include a command decoder 100, a detection signal generation circuit 200, an output enable signal generation circuit 300, a data input/output circuit 400, and a memory circuit 500.

The command decoder 100 may decode an external command CMD in synchronization with an external clock CLK, and generate an input signal IN. The command decoder 100 may decode the external command CMD in synchronization with the external clock CLK, and generate a write signal WT and a read signal RD. The external command CMD may be a signal received from an external source to control the semiconductor device. The external clock CLK may be a signal which is input from the external source to synchronize the operation of the semiconductor device. The external command CMD and the external clock CLK may be transmitted through lines through which at least one of an address, a command and data is transmitted. The external command CMD may be a signal including a plurality of bits, in an embodiment. The external clock CLK may be set as a signal which toggles. The input signal IN may be a signal which is generated from the external clock CLK and the external command CMD input from the external source.

The detection signal generation circuit 200 may generate a detection signal DET by detecting the phase difference of the input signal IN and an internal clock ICLK. The detection signal generation circuit 200 may generate first and second delayed input signals IND<1:2> by delaying the input signal IN. The detection signal generation circuit 200 may generate the first and second delayed input signals IND<1:2> by delaying the input signal IN by a delay amount controlled in response to first to third delay control signals DCTR<1:3>. The detection signal DET may be a signal which has a logic high value when a time interval between a generation time of the internal clock ICLK and an input time of the input signal IN is not equal to or greater than a preset period. For example, the detection signal DET has the logic high value when a time interval from a first time corresponding to a rising edge of the input signal IN to a second time corresponding to a rising edge of the internal clock ICLK is less than the preset period. The internal clock ICLK may be a signal which toggles. The internal clock ICLK may be generated using a phase-locked loop (PLL) or a delay-locked loop (DLL), which are disposed in the semiconductor device 2. The external clock CLK and the internal clock ICLK may be signals which have different phases.

The output enable signal generation circuit 300 may latch the first and second delayed input signals IND<1:2> in synchronization with the internal clock ICLK or an inverted version of the internal clock ICLK (or an inverted internal clock) in response to the detection signal DET, and output an output enable signal OEN which initiates a data transfer operation. The output enable signal generation circuit 300 may latch the first delayed input signal IND<1> in synchronization with the internal clock ICLK and output the latched signal as the output enable signal OEN which initiates a data transfer operation, when the detection signal DET has a logic low value. The output enable signal generation circuit 300 may latch the second delayed input signal IND<2> in synchronization with the inverted signal of the internal clock ICLK and output the latched signal as the output enable signal OEN which initiates a data transfer operation, when the detection signal DET has a logic high value. The output enable signal generation circuit 300 may count the first to third delay control signals DCTR<1:3> in response to the detection signal DET. The first to third delay control signals DCTR<1:3> may be signals for controlling an input time of the input signal IN.

The data input/output circuit 400 may input or output data DATA in synchronization with the internal clock ICLK in response to the output enable signal OEN. The data input/output circuit 400 may input or output data DATA in synchronization with the internal clock ICLK for a period in which the output enable signal OEN has the logic high value. The data input/output circuit 400 may receive data DATA from the external source and output the data DATA to the memory circuit 500, in synchronization with the internal clock ICLK for a period in which the output enable signal OEN has the logic high value, in a write operation. The data input/output circuit 400 may output data DATA received from the memory circuit 500 to the external source, in synchronization with the internal clock ICLK for a period in which the output enable signal OEN has the logic high value, in a read operation.

The memory circuit 500 may store the data DATA received from the data input/output circuit 400 in the write operation. The memory circuit 500 may store the data DATA received from the data input/output circuit 400, in response to the write signal WT. The memory circuit 500 may output the data DATA that has been stored in the write operation, to the data input/output circuit 400, in the read operation. The memory circuit 500 may output the data DATA that has been stored in the write operation, to the data input/output circuit 400, in response to the read signal RD.

Figure 9:
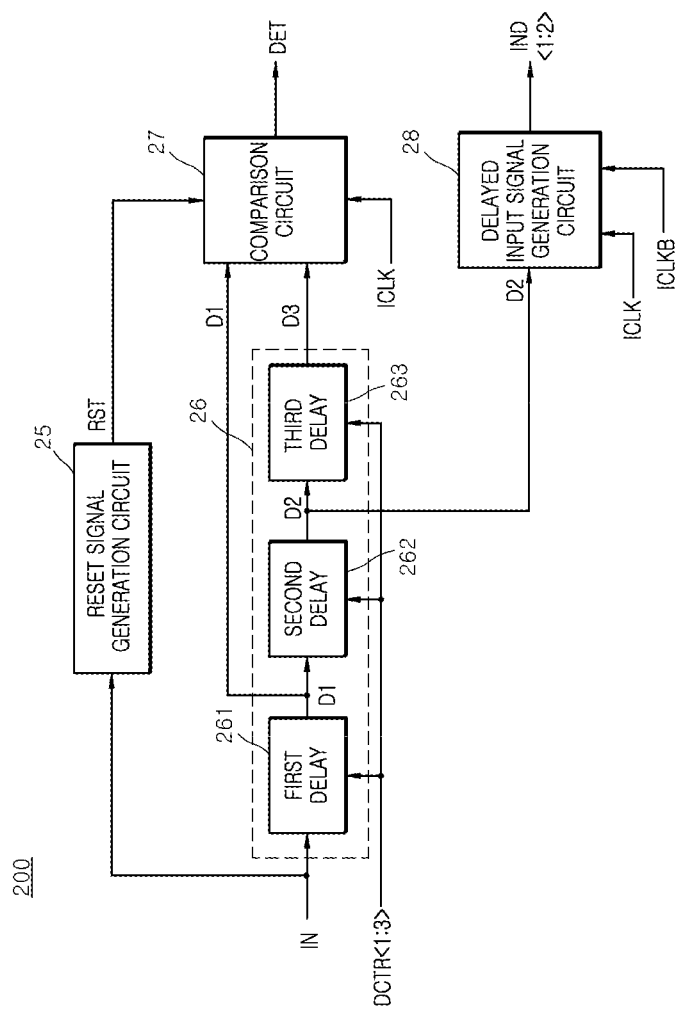
FIG. 9 is a block diagram illustrating a detection signal generation circuit included in the semiconductor device shown in FIG. 8, in accordance with an embodiment.

FIG. 9 is a block diagram illustrating a detection signal generation circuit suitable for use as the detection signal generation circuit 200 of FIG. 8, in accordance with an embodiment. Referring to FIG. 9, the detection signal generation circuit 200 may include a reset signal generation circuit 25, a delay signal generation circuit 26, a comparison circuit 27, and a delayed input signal generation circuit 28.

The reset signal generation circuit 25 may generate a reset signal RST which includes a pulse having a width corresponding to a predetermined period, in response to an input signal IN (e.g., the input signal IN of FIG. 8). The reset signal generation circuit 25 may generate the pulse in response to the input signal IN transitioning from a logic high value to a logic low value. Because the reset signal generation circuit 25 of FIG. 9 has the same configuration and performs the same functions as the reset signal generation circuit 21 of FIG. 3, detailed descriptions of an operation of the reset signal generation circuit 25 will be omitted herein for the interest of brevity.

The delay signal generation circuit 26 may include a first delay circuit 261, a second delay circuit 262, and a third delay circuit 263. The first delay circuit 261 may delay the input signal IN by a first delay amount set according to the first to third delay control signals DCTR<1:3> to generate a first delay signal D1. The second delay circuit 262 may delay the first delay signal D1 by a second delay amount set according to the values of the first to third delay control signals DCTR<1:3> to generate a second delay signal D2. The third delay 263 may delay the second delay signal D2 by a third delay amount set according to the first to third delay control signals DCTR<1:3> to generate a third delay signal D3. The first delay amount of the first delay 261, the second delay amount of the second delay 262, and the third delay amount of the third delay 263 may be substantially the same.

The delay signal generation circuit 26 may sequentially delay the input signal IN by the first delay amount, a sum of the first and second delay amounts, and a sum of the first, second, and third delay amounts to respectively generate the first delay signal D1, the second delay signal D2, and the third delay signal D3.

The comparison circuit 27 may generate a detection signal DET (e.g., the detection signal DET of FIG. 8) by comparing phases of the first delay signal D1 and the third delay signal D3 in synchronization with an internal clock ICLK (e.g., the internal clock ICLK of FIG. 8). The comparison circuit 27 may generate the detection signal DET by comparing the logic value of the first delay signal D1 and the logic value of the third delay signal D3 at a time corresponding to the rising edge of the internal clock ICLK. Because the comparison circuit 27 has the same configuration as and performs the same functions as the comparison circuit 23 shown in FIG. 4, detailed descriptions of an operation of the comparison circuit 27 will be omitted herein for the interest of brevity.

The delayed input signal generation circuit 28 may generate a first delayed input signal IND<1> by latching the second delay signal D2 in synchronization with the internal clock ICLK. The delayed input signal generation circuit 28 may generate a second delayed input signal IND<2> by delaying and then latching the second delay signal D2 in synchronization with an inverted internal clock ICLKB. Because the delayed input signal generation circuit 28 has the same configuration and performs the same functions as the delayed input signal generation circuit 24 shown in FIG. 5, detailed descriptions of an operation of the delayed input signal generation circuit 28 will be omitted herein for the interest of brevity.

Figure 10:
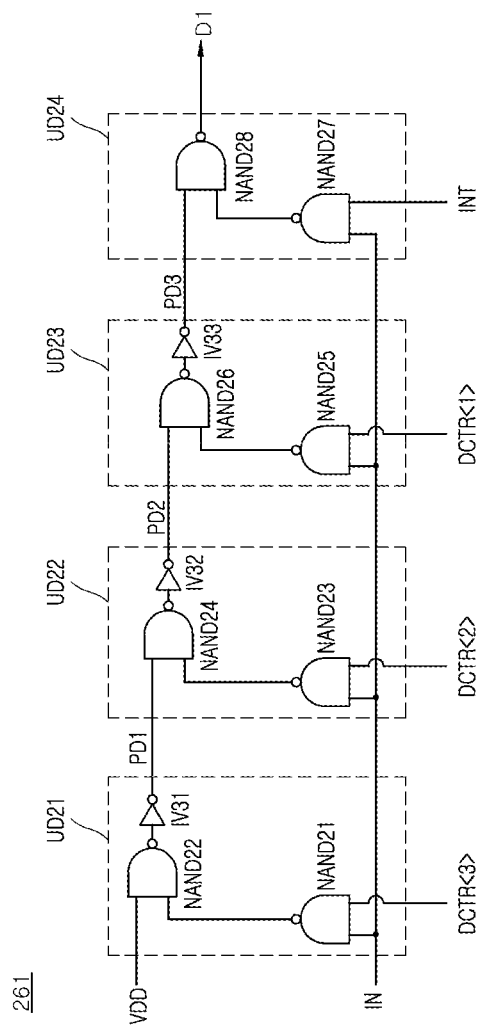
FIG. 10 is a circuit diagram illustrating a first delay circuit included in the detection signal generation circuit shown in FIG. 9, in accordance with an embodiment.

FIG. 10 is a circuit diagram illustrating a first delay circuit suitable for use as the first delay circuit 261 of FIG. 9, in accordance with an embodiment. Referring to FIG. 10, the first delay 261 may include a first unit delay circuit UD21, a second unit delay circuit UD22, a third unit delay circuit UD23, and a fourth unit delay circuit UD24.

The first unit delay circuit UD21 may include two NAND gates NAND21 and NAND22 and an inverter IV31. The first unit delay circuit UD21 may generate a first pre-delay signal PD1 by delaying an input signal IN (e.g., the input signal IN of FIG. 9) by a first delay amount in response to a power supply voltage VDD when a third delay control signal DCTR<3> has a logic high value. The first unit delay circuit UD21 may generate the first pre-delay signal PD1 having the logic high value in response to the power supply voltage VDD when the third delay control signal DCTR<3> has the logic low value, regardless of whether the input signal IN has the logic high value or the logic low value. The first delay amount may be equal to the sum of internal delay amounts of the NAND gates NAND21 and NAND22 and the inverter IV31.

The second unit delay circuit UD22 may include two NAND gates NAND23 and NAND24 and an inverter IV32. The second unit delay circuit UD22 may generate a second pre-delay signal PD2 by delaying the input signal IN by a second delay amount in response to the first pre-delay signal PD1 when the second delay control signal DCTR<2> has the logic high value. The second unit delay circuit UD22 may generate the second pre-delay signal PD2 by buffering the first pre-delay signal PD1 when the second delay control signal DCTR<2> has the logic low value. The second delay amount may be equal to the sum of the internal delay amounts of the NAND gates NAND23 and NAND24 and the inverter IV32.

The third unit delay UD23 may include two NAND gates NAND25 and NAND26 and an inverter IV33. The third unit delay UD23 may generate a third pre-delay signal PD3 by delaying the input signal IN by a third delay amount in response to the second pre-delay signal PD2 when the first delay control signal DCTR<1> has the logic high value. The third unit delay circuit UD23 may generate the third pre-delay signal PD3 by buffering the second pre-delay signal PD2 when the first delay control signal DCTR<1> has the logic low value. The third delay amount may be equal to the sum of the internal delay amounts of the NAND gates NAND25 and NAND26 and the inverter IV33.

The fourth unit delay circuit UD24 may be embodied by NAND gates NAND27 and NAND28. The fourth unit delay UD24 may generate the first delay signal D1 by delaying the input signal IN by a fourth delay amount when an initialization signal INT has the logic high value. The fourth unit delay circuit UD24 may generate the first delay signal D1 by inverting and buffering the third pre-delay signal PD3 when the initialization signal INT has the logic low value. The fourth delay amount may be equal to the sum of the internal delay amounts of the NAND gates NAND27 and NAND28. The initialization signal INT is a signal having the logic high value when all of the first to third delay control signals DCTR<1:3> have the logic low value. The initialization signal INT is a signal having the logic low value when any one of the first to third delay control signals DCTR<1:3> has the logic high value.

The first delay circuit 261 may generate the first delay signal D1 by delaying the input signal IN by the fourth delay amount of the fourth unit delay circuit UD24 when the initialization signal INT has the logic high value. The first delay circuit 261 may generate the first delay signal D1 by delaying the input signal IN by the sum of the third delay amount of the third unit delay UD23 and the delay amount of the NAND gate NAND28 when the first delay control signal DCTR<1> has the logic high value. The first delay 261 may generate the first delay signal D1 by delaying the input signal IN by the sum of the second delay amount of the second unit delay UD22, the third delay amount of the third unit delay UD23, and the delay amount of the NAND gate NAND28 when the second delay control signal DCTR<2> has the logic high value. The first delay 261 may generate the first delay signal D1 by delaying the input signal IN by the sum of the first delay amount of the first unit delay UD21, the second delay amount of the second unit delay UD22, the third delay amount of the third unit delay UD23, and the delay amount of the NAND gate NAND28 when the third delay control signal DCTR<3> has the logic high value.

Meanwhile, Because the second delay circuit 262 and the third delay circuit 263 of FIG. 9 have the same configuration and perform the same functions as the first delay circuit 261, detailed descriptions of operations of the second delay circuit 262 and the third delay circuit 263 will be omitted herein for the interest of brevity.

Figure 11:
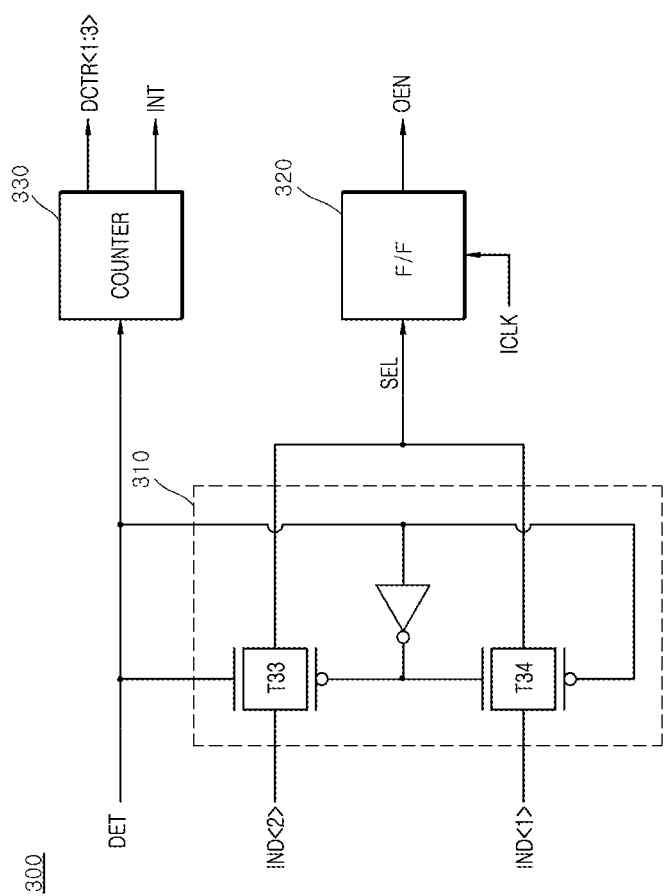
FIG. 11 is a diagram illustrating an output enable signal generation circuit included in the semiconductor device shown in FIG. 8, in accordance with an embodiment.

FIG. 11 is a block diagram illustrating an output enable signal generation circuit suitable for use as the output enable signal generation circuit 300 of FIG. 8, in accordance with an embodiment. Referring to FIG. 11, the output enable signal generation circuit 300 may include a selective transfer circuit 310, an output enable signal output circuit 320, and a counter 330.

The selective transfer circuit 310 may include first and second transfer gates T33 and T34. The first transfer gate T33 may be turned on when a detection signal DET (e.g., the detection signal DET of FIG. 8) has a logic high value, and output a second delayed input signal IND<2> as a select signal SEL. The second transfer gate T34 may be turned on when the detection signal DET is a logic low value, and output a first delayed input signal IND<1> as the select signal SEL. As a result, the selective transfer circuit 310 may output the second delayed input signal IND<2> as the select signal SEL when the detection signal DET has the logic high value, and may output the first delayed input signal IND<1> as the select signal SEL when the detection signal DET has the logic low value.

The output enable signal output circuit 320 may latch the select signal SEL in synchronization with an internal clock ICLK (e.g., the internal clock ICLK of FIG. 8), and output the latched select signal as the output enable signal OEN. For example, the output enable signal output circuit 320 may latch the select signal SEL in response to the internal clock ICLK transitioning from the logic low value to the logic high value. The output enable signal output circuit 320 may include a flip-flop.

The counter 330 may generate first to third delay control signals DCTR<1:3> (e.g., the first to third delay control signals DCTR<1:3> of FIG. 8) which are counted sequentially, in response to the detection signal DET. The counter 330 may generate the first to third delay control signals DCTR<1:3> which are counted sequentially, when the detection signal DET has the logic high value. The counter 330 may generate the initialization signal INT having the logic high value, when the first to third delay control signals DCTR<1:3> are not counted.

The output enable signal generation circuit 300 may output the first delayed input signal IND<1> as the output enable signal OEN when the detection signal DET has the logic low value, in synchronization with the internal clock ICLK. The output enable signal generation circuit 300 may output the second delayed input signal IND<2> as the output enable signal OEN when the detection signal DET has the logic high value, in synchronization with the internal clock ICLK. The output enable signal generation circuit 300 may generate the first to third delay control signals DCTR<1:3> which are counted sequentially, in response to the detection signal DET.

As described above, the semiconductor device 2 of FIG. 8 in accordance with another embodiment, performs a domain crossing operation between the input signal IN and the internal clock ICLK regardless of an input time of the input signal IN generated from the external clock CLK, leading to a stable data input/output operation. Also, the semiconductor device 2 of FIG. 8 in accordance with another embodiment, controls an input time of the input signal IN by comparing the input time of the input signal IN and a generation time of the internal clock ICLK, leading to a stable data input/output operation.

Figure 12:
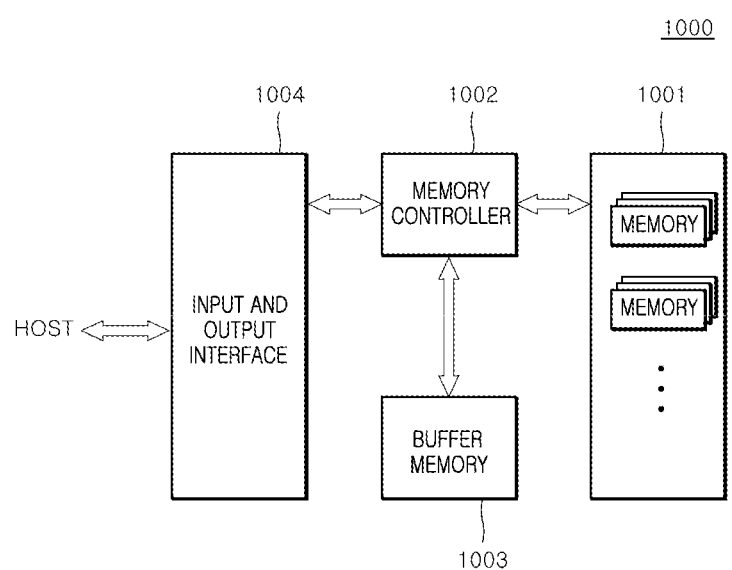
FIG. 12 is a diagram illustrating an electronic system including the semiconductor device shown in FIG. 1 or FIG. 8, in accordance with an embodiment.

The semiconductor device described above with reference to FIGS. 1 to 11 may be applied to an electronic system which includes a memory system, a graphic system, a computing system or a mobile system. For example, referring to FIG. 12, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include each of the semiconductor devices shown in FIGS. 1 and 8. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 12, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
    a command decoder receiving an external clock and an external command from an external source, and generating an input signal according to the external clock and the external command;
    a detection signal generation circuit suitable for generating a detection signal by detecting a phase difference of the input signal and an internal clock, the detection signal generation circuit generating delayed input signals by delaying the input signal; and
    an output enable signal generation circuit suitable for outputting an output enable signal to initiate a data transfer operation, by selecting one of the delayed input signals in response to the detection signal and latching the selected one of the delayed input signals in synchronization with the internal clock;
    wherein the output enable signal is a signal which is enabled for a predetermined period.

2. The semiconductor device according to claim 1, wherein the detection signal is a signal which is enabled in the case where a generation time of the internal clock and an input time of the input signal is less than a preset period.

3. The semiconductor device according to claim 1, wherein the external clock and the internal clock have different phases.

4. The semiconductor device according to claim 1, wherein the delayed input signals include first and second delayed input signals, and wherein the detection signal generation circuit comprises: a delay signal generation circuit suitable for generating a first delay signal, a second delay signal, and a third delay signal by sequentially delaying the input signal; a comparison circuit suitable for generating the detection signal by comparing phases of the first delay signal and the third delay signal in synchronization with the internal clock; and a delayed input signal generation circuit suitable for generating the first delayed input signal by latching the second delay signal in synchronization with the internal clock, the delayed input signal generation circuit suitable for generating the second delayed input signal by delaying the second delay signal and then latching the second delay signal in synchronization with an inverted version of the internal clock, the inverted version of the internal clock being an inverted internal clock.

5. The semiconductor device according to claim 4, wherein the comparison circuit comprises:
    an alignment signal generation circuit suitable for latching the first and third delay signals in synchronization with the internal clock, and outputting the latched first and third delay signals as first and second alignment signals, respectively;
    a transfer signal generation circuit suitable for generating a first transfer signal by comparing phases of the first alignment signal and the second alignment signal, the transfer signal generation circuit suitable for generating a second transfer signal by inverting and buffering the second alignment signal; and
    a logic circuit suitable for generating the detection signal which is enabled, in the case where any one of the first transfer signal and the second transfer signal is enabled.

6. The semiconductor device according to claim 4, wherein the delayed input signal generation circuit comprises:
    a first delayed input signal generation circuit suitable for latching the second delay signal in synchronization with the internal clock, and outputting the latched second delay signal as the first delayed input signal;
    a delay circuit suitable for generating an internal delay signal by delaying the second delay signal by a predetermined period; and
    a second delayed input signal generation circuit suitable for latching the internal delay signal in synchronization with the inverted internal clock, and outputting the latched internal delay signal as the second delayed input signal.

7. The semiconductor device according to claim 1, wherein the output enable signal generation circuit comprises:
    a selective transfer circuit suitable for outputting any one of the first delayed input signal and the second delayed input signal as a select signal in response to the detection signal; and
    an output enable signal output circuit suitable for latching the select signal in synchronization with the internal clock, and outputting the latched select signal as the output enable signal.

8. The semiconductor device according to claim 7, wherein the selective transfer circuit outputs the second delayed input signal as the select signal when the detection signal is enabled, and outputs the first delayed input signal as the select signal when the detection signal is disabled.

9. A semiconductor device comprising:
    a command decoder receiving an external clock and an external command from an external source, and generating an input signal according to the external clock and the external command;

a detection signal generation circuit suitable for generating a detection signal by detecting a phase difference of the input signal and an internal clock, the detection signal generation circuit suitable for generating delayed input signals by delaying the input signal; and an output enable signal generation circuit suitable for outputting an output enable signal to initiate a data transfer operation, by latching one of the delayed input signals in synchronization with the internal clock, and counting delay control signals for controlling an input time of the input signal, in response to the detection signal;

wherein the output enable signal is a signal which is enabled for a predetermined period.

10. The semiconductor device according to claim 9, wherein the detection signal is a signal which is enabled in the case where a generation time of the internal clock and an input time of the input signal is less than a preset period.

11. The semiconductor device according to claim 9, wherein the external clock and the internal clock have different phases.

12. The semiconductor device according to claim 9, wherein the delayed input signals include first and second delayed input signals, and wherein the detection signal generation circuit comprises:

a delay signal generation circuit suitable for generating a first delay signal, a second delay signal, and a third delay signal by delaying the input signal by first, second, and third delay amounts, respectively, the first, second, and third delay amounts being determined according to the delay control signals;

a comparison circuit suitable for generating the detection signal by comparing phases of the first delay signal and the third delay signal in synchronization with the internal clock; and a delayed input signal generation circuit suitable for generating the first delayed input signal by latching the second delay signal in synchronization with the internal clock, the delayed input signal generation circuit suitable for generating the second delayed input signal by delaying the second delay signal and then latching the second delay signal in synchronization with an inverted version of the internal clock, the inverted version of the internal clock being an inverted internal clock.

13. The semiconductor device according to claim 12, wherein the delay signal generation circuit comprises:

a first delay circuit suitable for delaying the input signal by the first delay amount to generate the first delay signal;

a second delay circuit suitable for delaying the first delay signal by the second delay amount to generate the second delay signal; and a third delay circuit suitable for delaying the second delay signal by the third delay amount to generate the third delay signal.

14. The semiconductor device according to claim 13, wherein each of the first, second, and third delay circuits includes a plurality of unit delay circuits, the plurality of unit delay circuits including first and second unit delay circuits, the first unit delay circuit outputting a pre-delay signal to the second unit delay circuit, and wherein the second unit delay circuit includes first and second NAND gates, the first NAND gate performing a first NAND logical operation on the input signal and a corresponding one of the delay control signals, the second NAND gate performing a second NAND logical operation on an output signal of the first NAND gate and the pre-delay signal from the first unit delay circuit.

15. The semiconductor device according to claim 12, wherein the comparison circuit comprises:

an alignment signal generation circuit suitable for latching the first and third delay signals in synchronization with the internal clock, and outputting the latched first and third delay signals as first and second alignment signals;

a transfer signal generation circuit suitable for generating a first transfer signal by comparing phases of the first alignment signal and the second alignment signal, the transfer signal generation circuit suitable for generating a second transfer signal by inverting and buffering the second alignment signal; and a logic circuit suitable for generating the detection signal which is enabled, in the case where any one of the first transfer signal and the second transfer signal is enabled.

16. The semiconductor device according to claim 12, wherein the delayed input signal generation circuit comprises:

a first delayed input signal generation circuit suitable for latching the second delay signal in synchronization with the internal clock, and outputting the latched second delay signal as the first delayed input signal;

a delay circuit suitable for generating an internal delay signal by delaying the second delay signal by a predetermined period; and a second delayed input signal generation circuit suitable for latching the internal delay signal in synchronization with the inverted internal clock, and outputting the latched internal delay signal as the second delayed input signal.

17. The semiconductor device according to claim 9, wherein the output enable signal generation circuit comprises:

a selective transfer circuit suitable for outputting any one of the first delayed input signal and the second delayed input signal as a select signal in response to the detection signal;

an output enable signal output circuit suitable for latching the select signal in synchronization with the internal clock, and outputting the latched select signal as the output enable signal; and a counter suitable for generating the delay control signals which are counted, in response to the detection signal.

18. The semiconductor device according to claim 17, wherein the selective transfer circuit outputs the second delayed input signal as the select signal in the case where the detection signal is enabled, and outputs the first delayed input signal as the select signal in the case where the detection signal is disabled.

* * * * *